United States Patent
Keshavarzi et al.

(10) Patent No.: US 6,765,414 B2
(45) Date of Patent: Jul. 20, 2004

(54) LOW FREQUENCY TESTING, LEAKAGE CONTROL, AND BURN-IN CONTROL FOR HIGH-PERFORMANCE DIGITAL CIRCUITS

(75) Inventors: Ali Keshavarzi, Portland, OR (US); Bhaskar P. Chatterjee, Portland, OR (US); Ram Krishnamurthy, Portland, OR (US); Manoj Sachdev, Ontario (CA)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/246,377

(22) Filed: Sep. 17, 2002

(65) Prior Publication Data

US 2004/0051558 A1 Mar. 18, 2004

(51) Int. Cl.[7] ............................................ H03K 19/096
(52) U.S. Cl. ............................ 326/93; 326/95; 326/112
(58) Field of Search ............................. 326/93, 95, 98, 326/16, 112, 119, 122

(56) References Cited

U.S. PATENT DOCUMENTS

| | | | | |
|---|---|---|---|---|
| 5,619,511 A | * | 4/1997 | Sugisawa et al. | 371/22.3 |
| 5,745,499 A | * | 4/1998 | Ong | 371/21.4 |
| 5,748,012 A | * | 5/1998 | Beakes et al. | 326/93 |
| 5,978,944 A | * | 11/1999 | Parvathala et al. | 714/726 |
| 6,570,407 B1 | * | 5/2003 | Sugisawa et al. | 326/93 |

OTHER PUBLICATIONS

M. Shashaani et al., *A Design for Test Technique for High Performance Circuit Testing*, IEEE International Test Conference, pp. 276–285, 1999.

V. D. Agrawal et al., *High Performance Circuit Testing with Slow Speed Testers*, Proc. of International Test Conference, pp. 302–310, 1995.

Y. Ye et al., *A New Technique for Standby Leakage Reduction in High Performance Circuits*, Symp. On VLSI Circuits, p. 40, 1998.

* cited by examiner

Primary Examiner—Daniel D. Chang
(74) Attorney, Agent, or Firm—Fish & Richardson P.C.

(57) ABSTRACT

A technique is described to allow testing of high-speed digital circuits using lower speed testing equipment, to circuits to be placed into a sleep mode, and to allow burn-in testing of digital circuits with minimal overhead in terms of silicon area or performance.

18 Claims, 7 Drawing Sheets

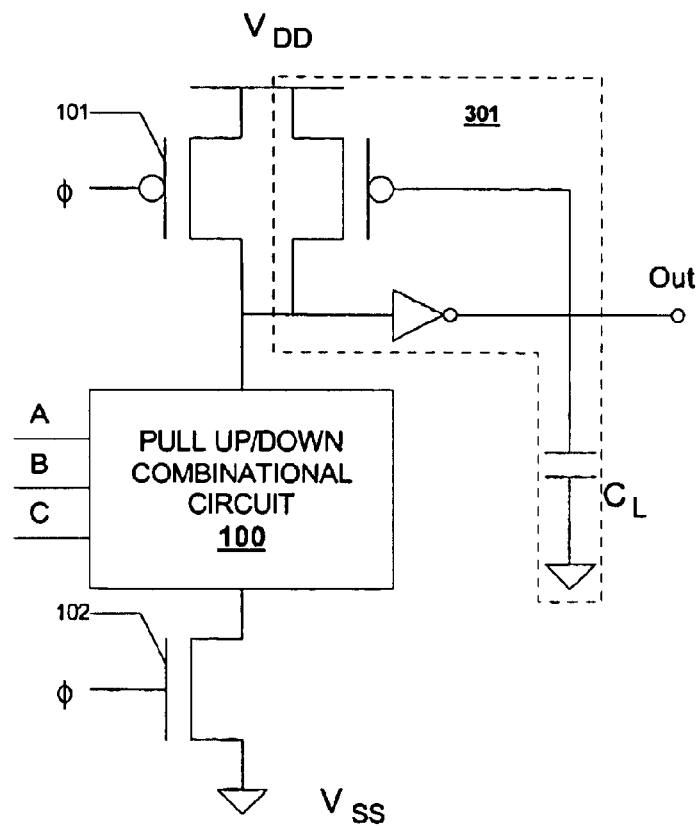
FIG. 3
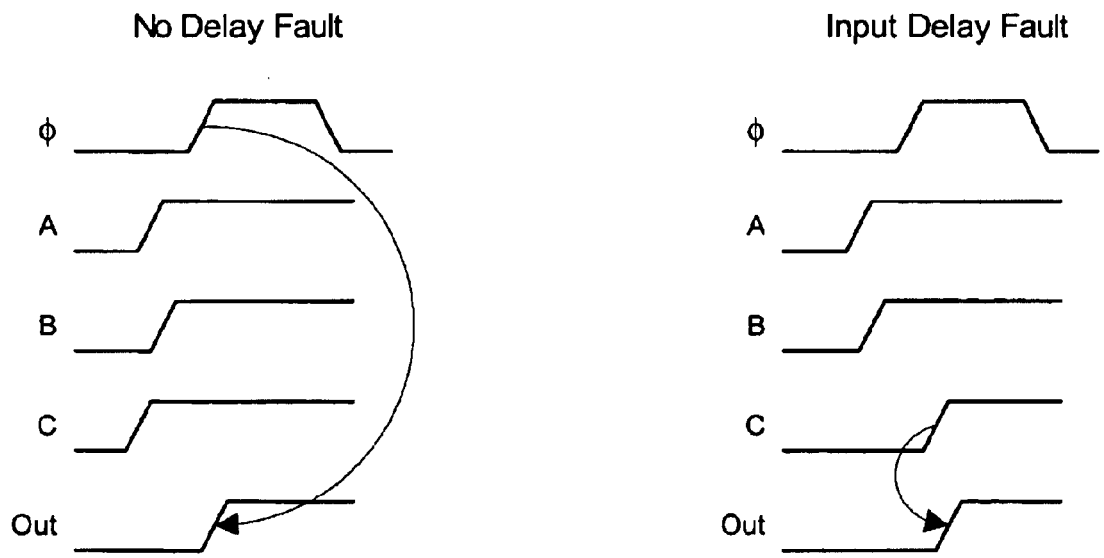
FIG. 4A  FIG. 4B

Dynamic Circuit With No Delay Faults

Dynamic Circuit With Delay Fault

LOW FREQUENCY TESTING, LEAKAGE CONTROL, AND BURN-IN CONTROL FOR HIGH-PERFORMANCE DIGITAL CIRCUITS

BACKGROUND

Complementary metal-oxide semiconductor (CMOS) devices are being scaled to improve performance. As supply and transistor threshold voltages are decreased, CMOS circuits exhibit greater sub-threshold leakage in their off-states. In high-performance circuits, a significant portion of total microprocessor power dissipation may be contributed by leakage power alone. In all designs, and particularly for low power designs, it is desirable to control and reduce the total leakage power.

Additionally, as the operating frequency of high-performance circuits increases, it is becoming more difficult to test the circuits to ensure correct functionality while maintaining high reliability. Advances in testing equipment have historically lagged behind advancements in semiconductor manufacturing technology. Thus, as clock speeds increase, the demands of testing high-performance circuits often surpasses the capabilities of conventional testing equipment. Thus, there is a need for test strategies that will allow slow speed testing. Additionally, the use of lower speed, less expensive testing equipment may reduce testing costs of high-speed circuits.

Finally, burn-in is a technique for stressing microprocessors at elevated temperatures and high voltage to ensure long-term reliability. By using burn-in to test devices beyond normal operating limitations, it is possible to reduce early device failures.

DESCRIPTION OF DRAWINGS

FIG. 3 is a schematic diagram of a dynamic circuit.

FIGS. 4A and 4B are exemplary timing diagrams for the dynamic circuit of FIG. 3, with and without delay faults.

DETAILED DESCRIPTION

As the operating frequency of high performance circuits increases, testing them for performance and ensuring long-term reliability is becoming increasingly difficult. Typically, testers need to have a 5 times or greater accuracy compared to the circuit under test (CUT). This often makes high performance testing expensive. Also, the presence of manufacturing defects and delay faults pose serious long-term reliability problems for the circuits being tested. Techniques are described below that address these issues, allowing the use of slow speed and relatively inexpensive testers to test high performance circuits, thereby cutting down on testing costs and at the same time ensuring performance evaluation. The techniques allow detection of delay faults and burn-in testing to ensure long-term reliability.

The techniques may provide some or all of the following benefits: (1) delay faults are transformed to easy to test stuck at faults; (2) the necessary modifications may be provided with minimal performance impact and minimal hardware overhead; and (3) performance binning is enabled.

In one general aspect, a technique may be provided through the addition of one or more testing transistors allowing (i) testing of high frequency parts at reduced frequency (e.g., 10 times nominal speed or even slower), (ii) introducing a sleep mode to switch-off logic blocks not being used allowing leakage control, or (iii) allowing burn-in control. Any combination of these features may be implemented with minimal overhead in terms of performance degradation and area penalty.

Some implementations described herein provide the following features: (1) allowing detection of delay faults and quantifying the faults in resistive terms thus increasing long-term reliability; (2) allowing slow speed testing of high-frequency parts—thus ensuring logic testing and usage of low frequency testers; (3) allowing the turning off of a logic block and putting it into "SLEEP" mode—thus reducing leakage power consumption; and (4) allowing testing of parts for burn-in at elevated temperature and voltage to ensure long-term reliability. In some implementations, all of the above described features may be implemented with minimal performance penalty and minimal transistor count overhead.

Figure 1A:
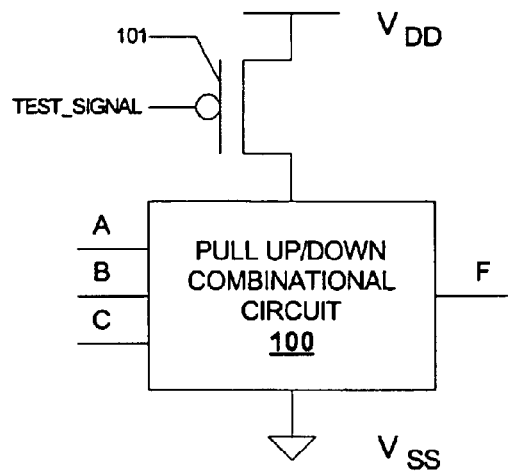
FIG. 1A is a schematic diagram of a combinational logic circuit with a pull-up testing transistor.

Referring to FIG. 1A, a combinational logic circuit 100 may be modified by adding pull-up testing transistor 101. Combinational logic circuit 100 includes inputs A, B, C and output F. Pull-up testing transistor 101 is controlled by TEST_SIGNAL. When TEST_SIGNAL is asserted (low), transistor 101 turns on and completes a path to $V_{CC}$ allowing combinational circuit 100 to operate. When TEST_SIGNAL is high, combinational circuit 100 has no path to $V_{CC}$, thus reducing leakage power consumption.

Figure 1B:
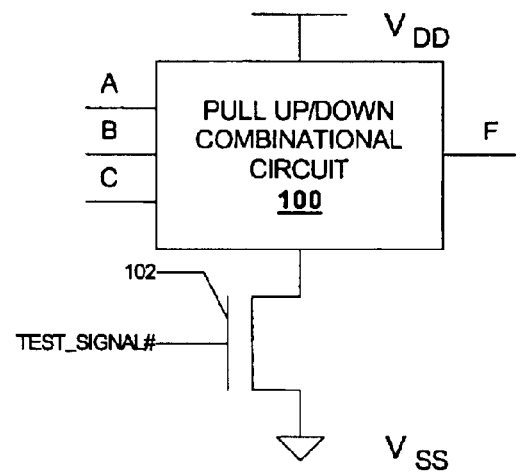
FIG. 1B is a schematic diagram of a combinational logic circuit with a pull-down testing transistor.

Referring to FIG. 1B, combinational logic circuit 100 is modified by adding a pull-down testing transistor 102 between the combinational logic circuit 100 and ground. Pull-down testing transistor 102 functions similar to pull-up testing transistor 101; when TEST_SIGNAL is asserted (high), pull-down testing transistor 102 completes a path to ground so that combinational logic circuit 100 may evaluate. When TEST_SIGNAL is deasserted (low), the combinational logic circuit 100 has no path to ground, thereby disabling the circuit and reducing leakage power.

Figure 1C:
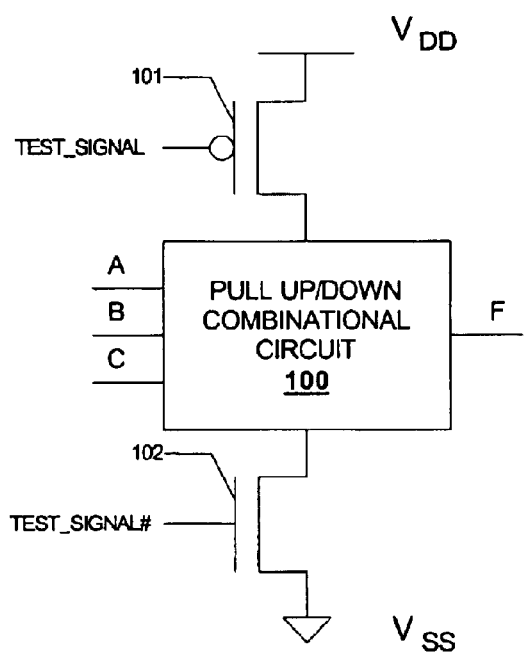
FIG. 1C is a schematic diagram of a combinational logic circuit with both a pull-up testing transistor and a pull-down testing transistor.

Referring to FIG. 1C, combinational logic circuit 100 may be modified to include both a pull-up testing transistor 101 and a pull-down testing transistor 102. These transistors, 101 and 102, operate as described above with reference to FIGS. 1A and 1B.

Figure 1D:
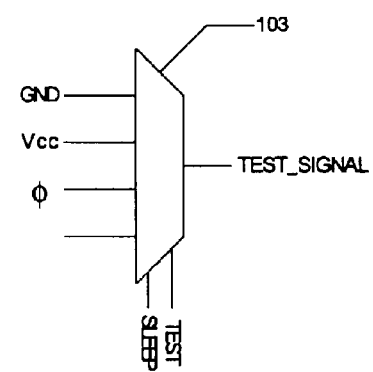
FIG. 1D is a schematic diagram of a multiplexer for generating a test signal for use in a circuit such as that shown in FIGS. 1A–1C.

Referring to FIG. 1D, as will be described in greater detail below, the addition of pull-up testing transistor 101 and/or pull-down testing transistor 102 provides various functionality that may be controlled through TEST_SIGNAL. This functionality may be controlled by providing implementations having multiple modes of operation. Multiplexer 103 may be used to control TEST_SIGNAL based on a selected mode of operation.

In some implementations, the circuit 100 may include a TEST mode and a NORMAL mode. In addition, each mode may further include submodes. In this example, the NORMAL mode includes a SLEEP submode and an ACTIVE submode. Depending on which mode the circuit is operating in, multiplexer 103 is used to route the appropriate signal to the gate of pull-up testing transistor 101 in Table 1 below.

TABLE 1

| Mode | TEST I/P | SLEEP I/P | CIRCUIT STATE | TEST_SIGNAL STATE |
|---|---|---|---|---|
| 1 | 0 | 0 | Normal Mode, Active | Gnd |
| 2 | 0 | 1 | Normal Mode, Sleep | Vcc |
| 3 | 1 | 0 | Test Mode, Logic Testing | CLK for Logic Testing |
| 4 | 1 | 1 | Test Mode, Burn-In Testing | CLK for Burn-In Testing |

Mode 1: When TEST and SLEEP inputs are both logic low, the circuit is in NORMAL, ACTIVE mode of operation. In this mode pull-up testing transistor 101 is ON so that the logic block can evaluate correctly the logic function F, depending on the logic states of the inputs A, B, C.

Mode 2: When TEST input is logic low and SLEEP input is logic high, the circuit is in NORMAL, SLEEP mode of operation. In this mode the pull-up testing transistor 101 is OFF. This ensures that there is at least one transistor between Vcc and ground that is turned off. This helps to cut-off the leakage current path between Vcc and Vss. This technique may decrease leakage of high-performance circuits and reduce power consumption.

Mode 3: When TEST input is logic high and SLEEP input is logic low, the circuit is in TEST mode and can be used for logic testing as described below with reference to FIG. 2.

The scheme shown in FIG. 1A allows detection of defects in the pull-up network or between the pull-up and pull-down networks. The scheme in FIG. 1B allows the detection of defects in the pull-down or between the pull-down and pull-up networks. Finally, the scheme in FIG. 1C allows detection of defects in both pull-up and pull-down networks. Because the signals A, B, C, and TEST_SIGNAL may be low frequency tester outputs, a relatively inexpensive tester can be used for testing the high-frequency parts for delay faults, thereby ensuring long-term reliability.

Mode 4: When TEST and SLEEP inputs are both logic high. This mode can be used for burn-in control. In this TEST mode, the logic block is excited using low frequency input signals A, B, C and a low frequency clock input applied to TEST_SIGNAL. The circuit can be tested at elevated temperature and voltage at low toggle rates to excite the internal nodes. Since the signals are low frequency in nature, the CUT can be excessively stressed and yet the leakage is managed by the sleep transistor.

This method allows testing for the performance specifications, of high speed circuits using lower frequency testers. Also, it can detect the presence of delay faults in the circuit and thereby help ensure long-term reliability of manufactured parts. It combines slow speed test techniques with leakage control and creates a burn-in mode for circuits using minimal hardware overhead. This may reduce testing cost of high-end digital circuits, ensuring higher reliability by detecting delay faults, and allowing burn-in control. It also allows low power operation by enabling effective leakage control.

Figure 2:
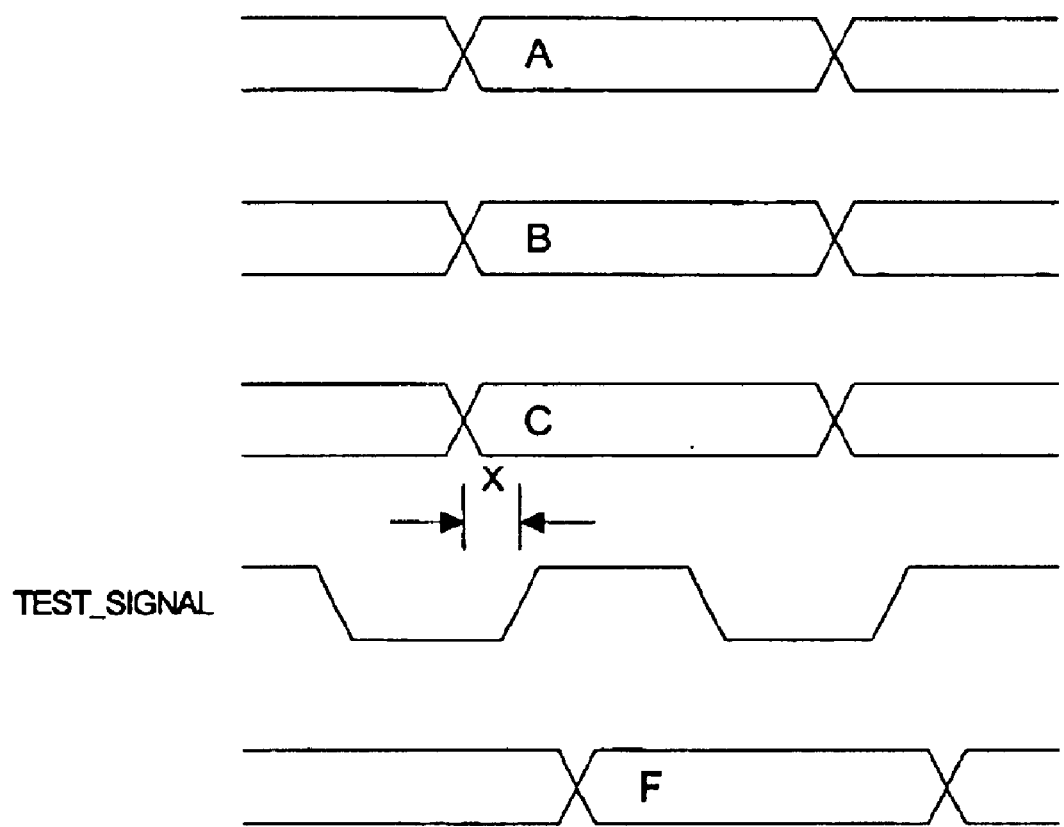
FIG. 2 is a timing diagram showing low frequency logic testing of a combinational logic circuit such as that shown in FIGS. 1A–1C.

Referring to FIG. 2, a combinational logic circuit 100 may be placed in a testing mode such that TEST_SIGNAL is an inverted-delayed clock signal offset by $X\ pS$ from input signals A, B, and C as shown in FIG. 2. For example, circuit 100 may be configured as shown in FIG. 1B. When TEST SIGNAL# is high, pull-down testing transistor 102 is asserted, completing a path to ground.

Circuit 100 may be tested using a low-frequency tester as follows. The circuit under test (CUT) is first put into Mode 3 using the TEST and SLEEP input combination shown in Table 1. Now, suppose the combinational circuit has been designed and needs to be tested for a delay specification of X picoseconds (pS). This means that X pS after A, B, C inputs to the combinational block reach their steady state, output F should reach its valid and correct logic state. To verify the functionality, signals with the timing as shown in FIG. 2 may be applied to the inputs A, B, C and TEST_SIGNAL of the CUT.

When using a low-frequency tester, the inputs A, B, C are low frequency signals applied to the CUT from a tester. These signals may have frequency 10 times or lower than nominal clock frequency. A phase shifted clock signal may be applied to the TEST_SIGNAL input from the tester. The delay between the input data signals (A, B, C) and TEST_SIGNAL may be set to the delay for which the combinational block is being tested. If the circuit is functioning properly, it will evaluate correct logic values depending on the inputs and implemented logic function F, and should reach correct stable logic state within X pS. However, if there are internal delay faults, bridging faults, manufacturing defects, or other defects, the evaluation may take more time and F will not reach correct logic state in X pS. This may cause a detectable and erroneous logic output at F. Moreover, by varying the edge placement of the TEST_SIGNAL with respect to A, B, C inputs it is possible to quantify the extent of the delay faults. This mode of operation thus tests the logic for performance and possible existence of manufacturing defects.

Referring to FIG. 3, a combinational logic circuit 100 may include a pull-up testing transistor 101 and a pull-down testing transistor 102 as discussed above with reference to FIG. 1C. The circuit also includes an output inverter 301 to hold the output value while the TEST_SIGNAL is deasserted.

A method for testing static logic in a low frequency TEST mode by multiplexing a tester clock pins and introducing externally quantifiable delay has been proposed. This allows enhancing the frequency range of testers used to test the CUTs.

Referring to FIGS. 4A and 4B, a typical dynamic circuit, such as the dynamic gate shown in FIG. 3, includes various inputs and outputs. For a dynamic gate without delay faults, the circuit may have a timing diagram such as that shown in FIG. 4A. Similarly, an exemplary timing diagram for a dynamic gate with delay faults is shown in FIG. 4B. The dynamic gate can evaluate during the entire duration for which signal f is high and as a result, internal delay faults can go undetected as shown in FIG. 4B resulting in serious long-term reliability problems.

Figure 5:
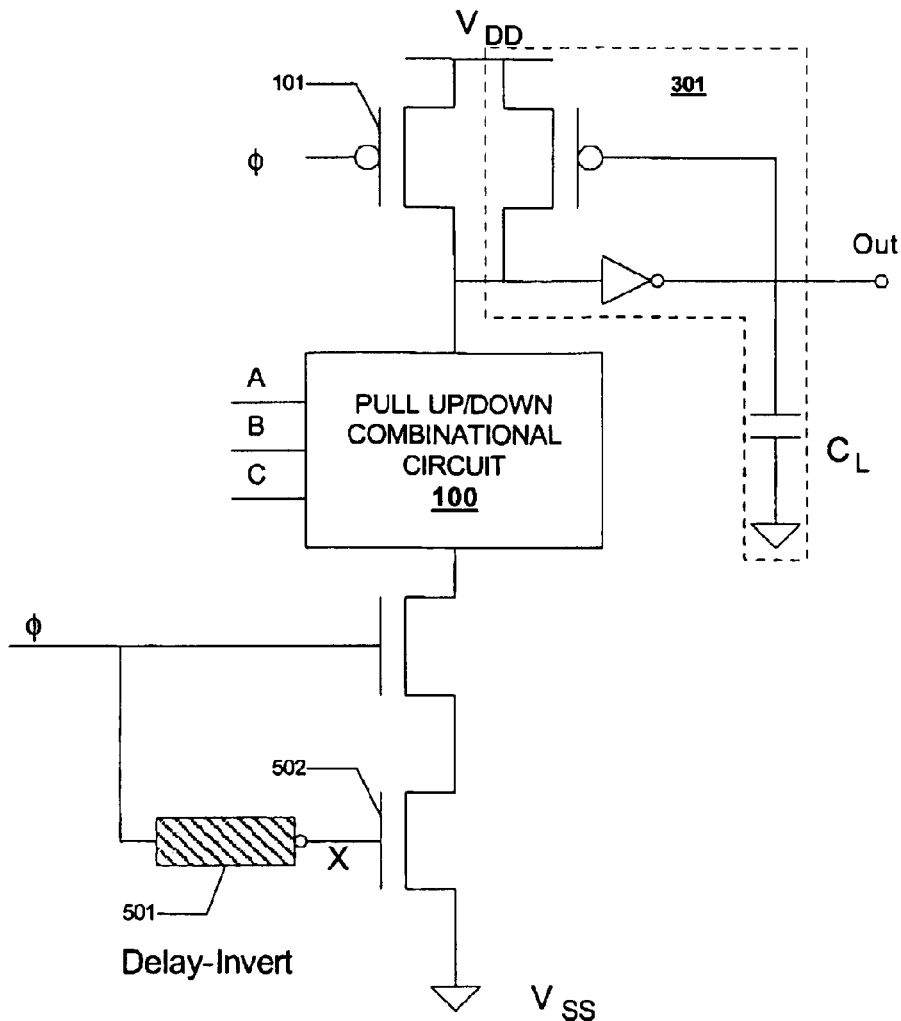
FIG. 5 is a schematic diagram of a dynamic circuit with a testing transistor.
Figure 6:
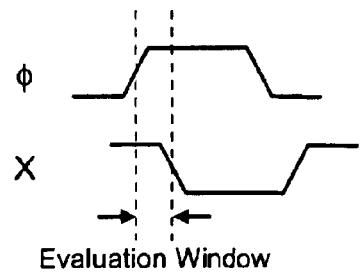
FIG. 6 is a timing diagram describing the evaluation window of the dynamic circuit described in FIG. 5.

Referring to FIGS. 5 and 6, a dynamic gate may be modified by adding a delay-invert block 501. The delay-invert block 501 enables generation of a delayed signal X from the input signal ϕ and ensures that the dynamic gate has a fixed evaluation window as shown in FIG. 6.

Figure 7A:
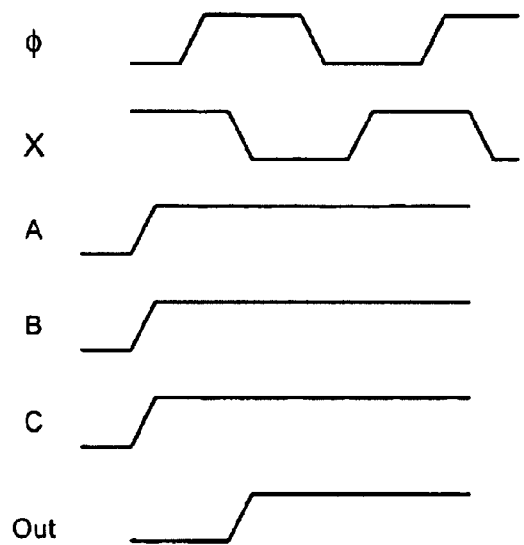
FIGS. 7A and 7B are exemplary timing diagrams for the dynamic circuit of FIG. 5, with and without delay faults.
Figure 7B:
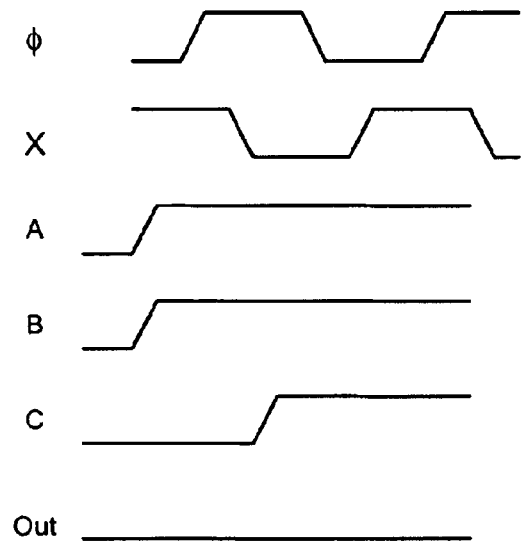

Referring to FIGS. 7A and 7B, for the sake of simplicity, the timing diagram of a 3-input NAND gate is presented. When inputs A, B, C go high, the dynamic gate evaluates to 0 and Out node is pulled high as shown in FIG. 7A. However, if due to some reason there exists delay faults at any of the inputs or inside the gate, the CUT fails to evaluate correctly and results in a stuck-at fault at the output as shown in FIG. 7B.

Figure 8:
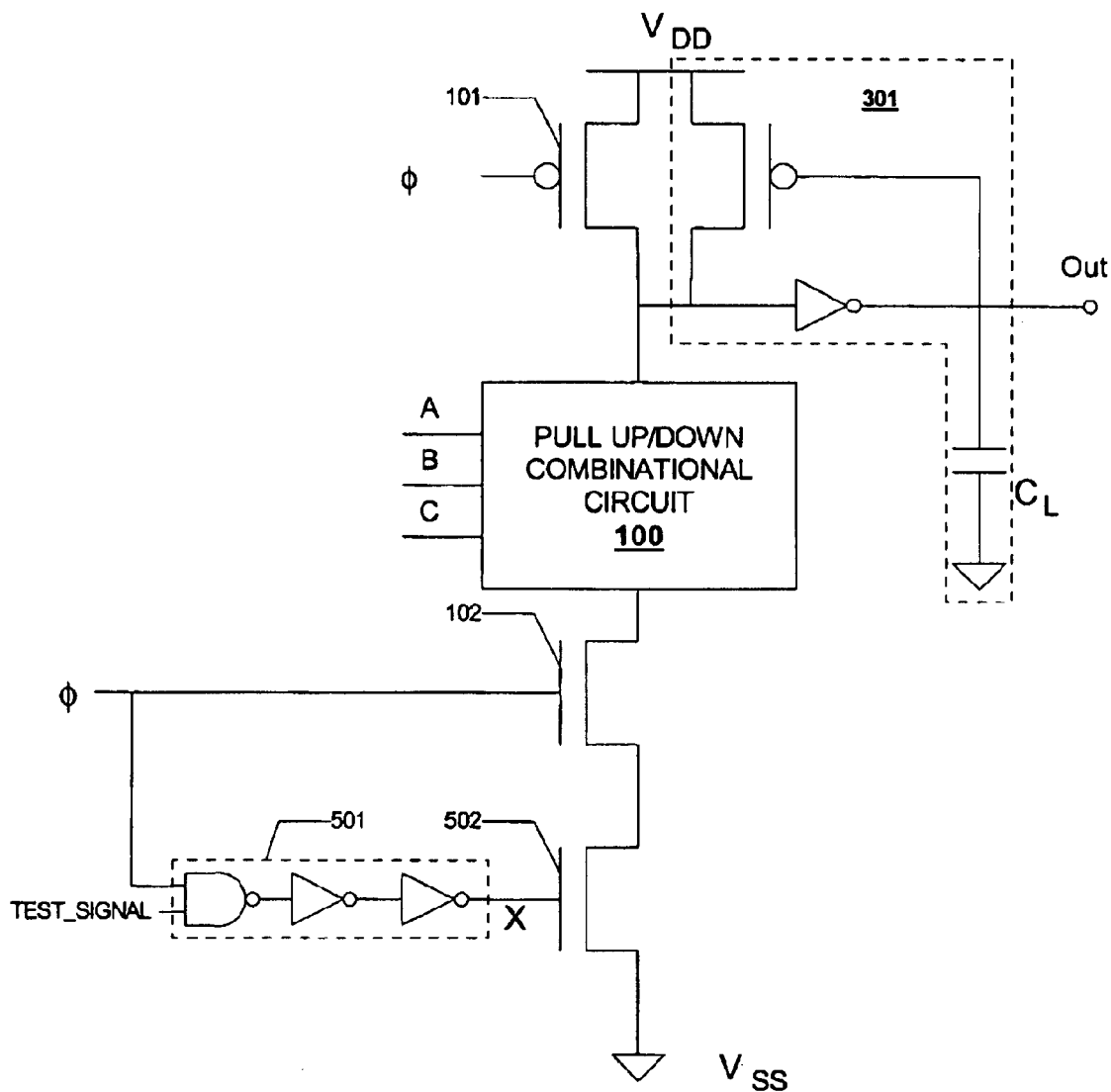
FIG. 8 is a schematic diagram of a dynamic circuit with a testing transistor having a testing signal delayed by an inverter delay chain.

Referring to FIG. 8, the circuit described with reference to FIG. 5 may include a fixed delay. For example, the circuit may include a NAND-gate and a series of cascaded inverters to provide a fixed delay between the clock signal Φ and the test signal.

Figure 9:
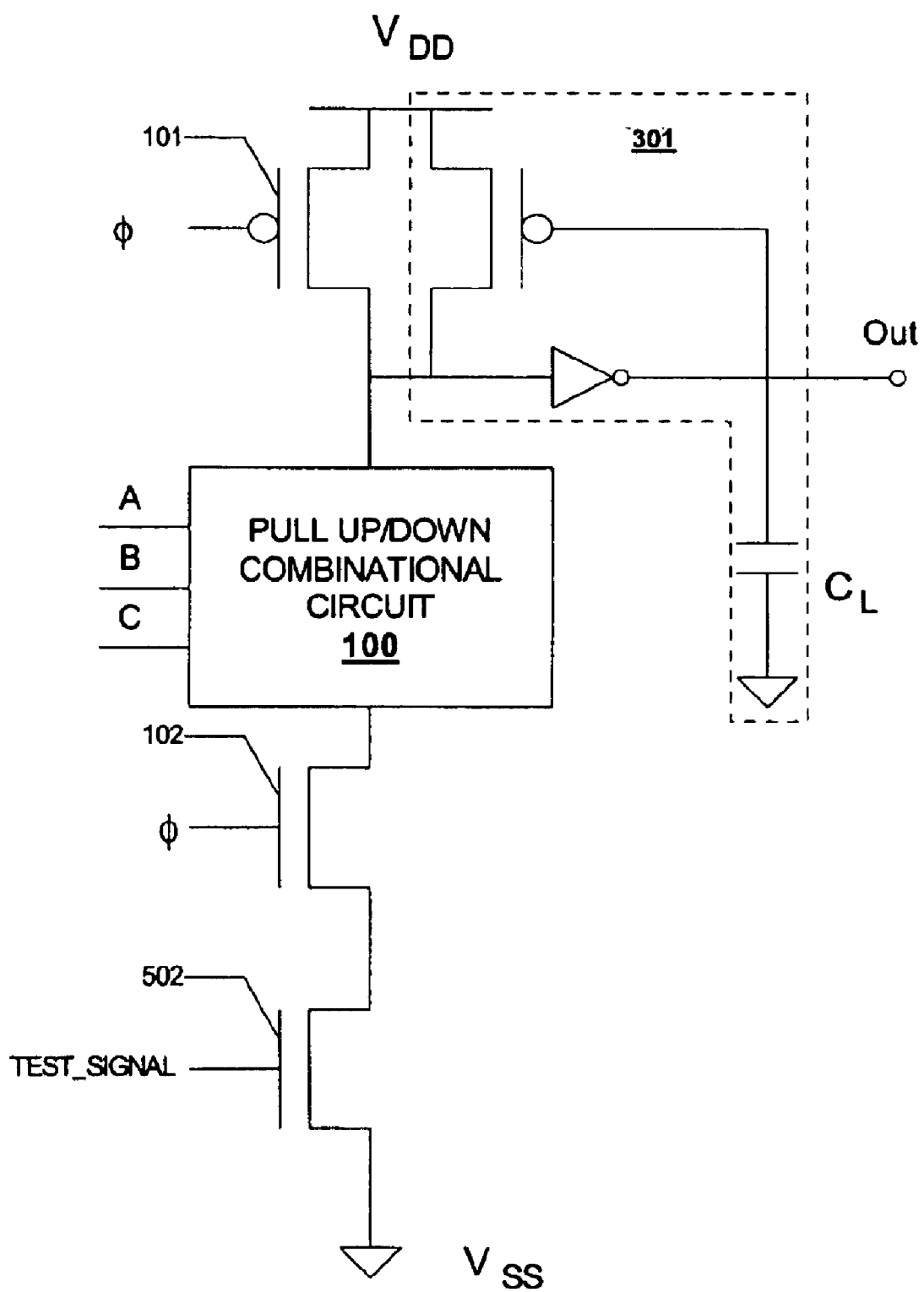
FIG. 9 is a schematic diagram of a dynamic circuit with a testing transistor having a testing signal with no delay.

Referring to FIG. 9, the circuit described with reference to FIG. 5 can be modified and the concept further extended. Instead of a signal having a fixed delay with respect to a clock, a signal with programmable delay may be applied to the gate of the testing transistor 502. This enables the quantification of the delay fault and performance binning of the CUT. Testing may be performed at a relatively low frequency (e.g., 10 times lower than nominal frequency), thus allowing low-frequency testers to be used.

This method may provide significant reduction of testing cost of high-performance circuits by allowing lower frequency testers to be used. Additionally, it may allow detection of delay faults that might be present in the circuit, allow performance binning, and ensure long-term reliability of the high-performance circuits being manufactured.

Other implementations are within the scope of the following claims.

What is claimed is:

1. A digital circuit comprising:
  a circuit having one or more input nodes and an output node, the circuit including a path to ground and a path to power;
  a first test signal node;
  a first transistor coupled to the a circuit and coupled to the first signal node, the first transistor operable to receive a first signal through the first signal node and operable to complete at least one of the path to ground or the path to power of the circuit when the first test signal is asserted; and
  a multiplexer including input signal nodes, control signal nodes, and an output signal node, the output signal node coupled to the first signal node such that an input signal received by one of the input signal nodes is sent to the output signal node based on a control signal received through the control signal nodes.

2. The digital circuit of claim 1 wherein the first transistor is operable to break the path to ground of the circuit.

3. The digital circuit of claim 2 further comprising:
  a second signal node; and
  a second transistor coupled to the circuit and coupled to the second signal node, the second transistor operable to receive a second signal through the second signal node and operable to complete the path to power of the circuit when the second signal is asserted.

4. The digital circuit of claim 3 wherein the second signal is an inversion of the first signal.

5. The digital circuit of claim 1 wherein the input signal nodes include a power signal, a ground signal, and a clock signal.

6. The digital circuit of claim 1 wherein the circuit includes a test mode and a normal mode and wherein the control signal includes a primary mode selector, the primary mode selector selectively operable to place the circuit in the test mode or the normal mode.

7. The digital circuit of claim 6 wherein the control signal further includes a secondary mode selector.

8. The digital circuit of claim 7 wherein the normal mode includes an active mode and a sleep mode and wherein the secondary mode selector is selectively operable to place the circuit in the sleep mode or the active mode when the normal mode is selected.

9. The digital circuit of claim 7 wherein the test mode includes a logic testing mode and a burn-in testing mode and wherein the secondary mode selector is selectively operable to place the circuit in the logic testing mode or the burn-in testing mode when the test mode is selected.

10. The digital circuit of claim 1, further comprising a delay-invert block coupled to the first switching element, the delay-invert block being operable to generate a delayed signal from the first signal.

11. The digital circuit of claim 1, further comprising an inverter circuit coupled to the first switching element, the inverter circuit operable to hold an output value from the first switching element.

12. A method comprising:
  providing a switching element including a test signal node, the switching element being coupled to a digital circuit including input signal nodes, an output signal node, a path to power and a path to ground, the digital circuit having a test mode and a normal mode, the switching element operable to complete the path to power or to complete the path to ground of the digital circuit;
  applying input signals to the input signal nodes;
  setting a delay period based on an expected time period between (a) when the input signals reach a steady state and (b) when an output signal from the output signal node reaches a valid logic state;
  applying a test signal to the test signal node such that the switching element completes the path to power or the path to ground of the digital circuit after the delay period;
  receiving the output signal from the output signal node; and
  determining if the output signal correctly corresponds to the input signals and the expected time period between (a) when the input signals reach the steady state and (b) when the output signal from the output signal node reaches the valid logic state.

13. The method of claim 12 wherein the test signal applied to the test signal node is delayed by passing the test signal through a delay-invert unit, the delay-invert unit including a chain of inverters.

14. The method of claim 12 wherein said applying a test signal to the test signal node includes asserting the test signal after applying the input signals so that the test signal is received at the test signal node after the delay period.

15. The method of claim 12 wherein the switching element is operable to complete the path to ground of the digital circuit, the method further comprising providing a second switching element operable to complete the path to power of the digital circuit.

16. A method comprising:
  providing a switching element including a control signal node, the switching element being coupled to a digital circuit including input signal nodes, an output signal node, a path to power and a path to ground, the digital circuit having a test mode, a normal mode, and a sleep mode, the switching element operable to break the path to power or to break the path to ground of the digital circuit when the digital circuit is in the sleep mode;

applying input signals to the input signal nodes in the test mode;

setting a delay period based on an expected time period between (a) when the input signals reach a steady state and (b) when an output signal from the output signal node reaches a valid logic state;

constructing an evaluation window by applying a test signal to the control signal node such that the switching element completes the path to power or the path to ground of the digital circuit after the delay period;

receiving an output signal from the output node after the delay period; and determining whether the output signal correctly propagates during the evaluation window by comparing the output signal to an expected output signal.

17. The method of claim 16 further comprising placing the digital circuit in sleep mode by applying a control signal to the control signal node such that the switching element breaks the path to power or the path to ground of the digital circuit.

18. The method of claim 16 further comprising performing burn-in testing of the digital circuit.

* * * * *